(12) United States Patent
Park et al.

(10) Patent No.: US 9,060,522 B2
(45) Date of Patent: Jun. 23, 2015

(54) WALNUT SUPPLY APPARATUS

(76) Inventors: Dong Woo Park, Seoul (KR); Hae Ok Yoon, Seoul (KR); Byung Yong Yoon, Seoul (KR)

( * ) Notice: Subject to any disclaimer, the term of this patent is extended or adjusted under 35 U.S.C. 154(b) by 372 days.

(21) Appl. No.: 13/542,038

(22) Filed: Jul. 5, 2012

(65) Prior Publication Data

US 2013/0025473 A1    Jan. 31, 2013

(30) Foreign Application Priority Data

Jul. 25, 2011    (KR) .................. 10-2011-0073634

(51) Int. Cl.
| | |
|---|---|
| *A21B 5/00* | (2006.01) |
| *A21C 9/08* | (2006.01) |
| *H05K 13/02* | (2006.01) |
| *B65G 47/14* | (2006.01) |

(52) U.S. Cl.
CPC .............. *A21C 9/081* (2013.01); *H05K 13/028* (2013.01); *B65G 47/1421* (2013.01)

(58) Field of Classification Search
CPC ............................. A23P 1/082; H05K 13/028
USPC ............ 99/451, 427, 494; 221/200, 205, 202, 221/203, 209, 167
See application file for complete search history.

(56) References Cited

U.S. PATENT DOCUMENTS

| | | | | |
|---|---|---|---|---|
| 5,441,756 A | * | 8/1995 | Wadell | 426/556 |
| RE38,478 E | * | 3/2004 | Fitch et al. | 118/13 |
| 8,393,495 B2 | * | 3/2013 | Kim | 221/13 |
| 2002/0148364 A1 | * | 10/2002 | Dziugys et al. | 99/494 |
| 2011/0041706 A1 | * | 2/2011 | Whetstone, Jr. | 99/353 |

FOREIGN PATENT DOCUMENTS

| | | |
|---|---|---|
| JP | 2007308216 | 11/2007 |
| KR | 1020090132671 | 12/2009 |

* cited by examiner

*Primary Examiner* — Reginald L Alexander
(74) *Attorney, Agent, or Firm* — Cantor Colburn LLP

(57) ABSTRACT

Disclosed herein is a walnut supply apparatus including: a vibrator applying vibration to a walnut grain to move the walnut grain; a walnut discharging guide part formed at an upper portion of the vibrator to discharge the walnut grain from the vibrator; a feeder formed at one end of the walnut discharging guide part along a moving direction of the walnut grain to supply the walnut grain into a mold; a feeder driving part pivoting the feeder to drop the walnut grain disposed on the feeder into the mold; and a mold driving unit cyclically transferring the mold along a predetermined path. The walnut supply apparatus according to the present invention may accurately supply the walnut grain to the mold without using an additional sensor.

19 Claims, 13 Drawing Sheets

WALNUT SUPPLY APPARATUS

TECHNICAL FIELD

The present invention relates to a walnut supply apparatus, and more particularly, to a walnut supply apparatus capable of automatically supplying a walnut grain or a walnut kernel into a mold using mechanical synchronization without a sensor allowing a position of the mold and a supply timing of the walnut grain to coincide with each other.

BACKGROUND ART

An existing walnut cake baking machine is independently manually supplied with a walnut grain one by one to thereby be operated. Here, a process of introducing walnut cake materials into a mold and a process of discharging a completely baked walnut cake in a heating process is performed by hands of a worker.

Therefore, in a place at which a lot of people are gathering, such as a highway service area, a station front, a terminal, an amusement park, or the like, in the case of installing a manual walnut cake baking machine in a manual mode, it was difficult to mass-produce the walnut cake, and since the entire process has been performed by hands of the worker, many workers have been unnecessarily required, thereby causing a manufacturing cost to increase and the worker to easily feel tired.

A patent regarding a walnut cake baking machine automated so as to make it possible to bake a lot of walnut cakes at the highway service area, the station front, the terminal, the amusement park, or the like a short time has been filed (Korean Patent Application No. 10-2008-0058765, hereinafter, referred to as "the related art").

FIGS. 1 to 3 are views showing a walnut automatic supply apparatus according to the related art. Since descriptions of reference numerals that will not described below among reference numerals represented in FIGS. 1 to 3 was provided in the related art, descriptions thereof will be omitted.

As shown in FIGS. 1 to 3, the walnut automatic supply apparatus 1 automatically supplying a walnut grain 9 to a mold 18 installed in a walnut cake baking machine 11 according to the related art is installed, and an upper portion of a body 6 is provided with the walnut automatic supplying apparatus 1, a kneading trough 12 having a quantitative feeder, and a container so as to allow the walnut grain 9, dough, and contents to be supplied to the mold 18 while repeating stop and movement of a plurality of molds 18 installed adjacent to each other in a row according to a program preset in a controlling part 22 in a state in which, although not shown in the accompanying drawings, a moving unit and a heating unit are installed in the body 6 in a box shape.

In addition, one side of the body 6 of the walnut cake baking machine 11 is installed with a walnut cake discharging arm 15 so as to separate and discharge completely baked walnut cake from the mold 18, and a front surface of the body 6 is attached with the controlling part 22, which is a control box, capable of the walnut automatic supply apparatus 1 and the walnut cake baking machine 11.

Therefore, before the dough and the contents are introduced into the mold 18 automatically moving and stopping on the body 6 of the walnut cake baking machine 11, walnut grain is automatically supplied to the mold 18.

Meanwhile, the walnut automatic supply apparatus 1 automatically supplying the walnut grain 9 is configured to include a vibration device 7, a walnut regular position confirming unit 2, a gate opening and closing unit 3, a walnut moving unit 4, and a gate opening and closing driving unit 5.

The vibration device 7 includes a vibration device support 14 vertically bent so as to have a predetermined height in order not to hinder the mold 18 moving on an upper surface of the body 6.

The vibration device 7 attached to an upper portion of the vibration device support 14 moves the walnut grain 9 filled therein to the walnut regular position confirming unit 2 in a row using vibration.

The vibration device 7, which has a cylindrical shape in which it has an opened upper surface, includes a vibration plate 29 installed on a bottom to which the walnut grain 9 filled therein are moved along a hopper 8 by the vibration and the hopper 8 spirally formed in an inner peripheral surface thereof so that the walnut grain may be moved to the walnut regular position confirming unit 2 positioned at an upper portion thereof by the vibration of the vibration plate 29.

In addition, an upper front end of the hopper 8 installed in the vibration device 7 is installed with the walnut regular position confirming unit 2 sensing whether or not the walnut grain arrives at the gate opening and closing unit 3, in order to supply the walnut grain 9 to the mold 18.

The walnut regular position confirming unit 2 is configured of a walnut entering check sensor (not shown) installed so as to be connected to an upper distal end of the hopper 8 of the vibration device 7 to sense that the walnut grain 9 enter the gate opening and closing unit 5 and the walnut regular position confirming unit 2 sensing whether or the walnut grain supplied to the gate opening and closing unit 3 are located at the gate opening and closing unit 3.

Further, in a state in which the supplied walnut grain is confirmed by the walnut regular position confirming unit 2, the gate opening and closing unit 3 supplying the walnut grain 9 to the walnut moving unit 4 opens a discharging gate (not shown) to supply the walnut grain 9.

Therefore, the gate opening and closing unit 3 includes a walnut discharging gate box 32 serially connected to the upper distal end of the hopper, the discharging gate having a one side hinge-fastened to a lower portion of the gate box and vertically rotating, and a gate operating wire 17 having both ends connected to each other fastened to a side of the discharging gate so as to be opened and closed by an operation of the gate opening and closing driving unit 5.

In addition, in order to return the discharging gate opened by pulling the gate operating wire 17, a side of the discharging gate box 32 and the side of the discharging gate is installed with a gate return spring 39 having fixed both ends.

The gate opening and closing driving unit 5 driving so as to vertically open and close the gate the gate opening and driving unit 3 connects a lower end thereof to one side end of the driving shaft 23 driving the quantitative feeder supplying the dough of the kneading trough to hinge-connected d a rotating operating hinge 24 thereto, and a upper end of the operating hinge 24 is connected to a link 25 connecting one sides to rotate together with each other.

In addition, a vertical bar 27 having a fixed lower distal end to move front and rear is fixed to the other side of the link 25, the gate operating wire 17 is fastened to an upper portion of the vertical bar 27 so as to be horizontally coupled thereto to open and close the discharging gate, and a horizontal bar 28 having a fixed bar 40 vertically stood is fixed to the other side end.

A moving block 26 fitted into the fixed bar 40 of the horizontal bar 28 to slidably move has a long hole formed therein in a length direction, and a rod 41 is attached to one side of the moving block 26 so as to slidably move together with each other.

The other distal end of the rod 41 has a walnut cake discharging cam 13 attached to a side of a walnut cake pipe fixed support 19 of the walnut moving unit 4 to rotate.

Further, in the walnut moving unit 4 supplying the walnut grain supplied by the gate opening and closing unit 3 to the mold 18, a walnut discharging slide 10 is positioned at a lower portion of the discharging gate to attach an upper portion thereof to the walnut discharging gate box 32 of the gate opening and closing unit 3 so that the walnut grain 9 slides.

In addition, the walnut cake pipe fixed support 19 attached to a front end of the vibration device support 14 is attached to a lower portion of the walnut discharging slide 10 so as to supply the walnut grain 9 sliding in a state in which they are separated apart from each other to the mold 18.

An inner portion of the walnut cake pipe fixed support 19 is connected to a walnut discharging funnel 16, and a lower portion of the walnut discharging funnel 16 is connected to a walnut discharging pipe and walnut discharging tube 21, sequentially.

In addition, the walnut automatic supply apparatus according to the related art includes the controlling part 22 controlling the vibration device 7, the walnut regular position confirming unit 2, and the gate opening and closing unit.

Therefore, according to the related art, in order to supply the walnut grain 9 to the mold automatically moving on the body 6, when the vibration device 7 vibrates in a state in which it stops before the dough filled in the kneading trough is supplied, the walnut grain 9 moves along the hopper 8 to the walnut regular position confirming unit 2, the gate opening and closing driving unit 5 is driven in a state in which the walnut grain is confirmed by the walnut entering check sensor 30 and a walnut regular position sensing sensor 31, the operating hinge 24 is rotated, the link 25 is pulled forwardly, the vertical bar 27, the horizontal bar 28, and the rod 41 are pulled forwardly together with each other, and then the walnut discharging cam 13 is rotated.

In this case, when the gate operating wire 17 connecting the horizontal bar 28 and the discharging gate to each other is also pulled together to pull and open the discharging gate so that the discharging gate downwardly to rotate, the walnut grain 9 slides on the walnut discharging of the walnut moving unit 4 to thereby be supplied to the mold 18 through the walnut discharging funnel 16, the walnut discharging pipe 20, and the walnut discharging tube 21.

In addition, when the operating hinge 24 fastened to the driving shaft 23 rotates to be returned, other slid units are also sequentially returned, the discharging gate is simultaneously closed by being pulled by the gate return spring 39, the stopped vibration device 7 vibrates to allow the walnut grain 9 to be positioned on the upper surface of the discharging gate, the walnut regular position sensing sensor 31 senses whether or not the walnut grain 9 enters, and then the vibration device 7 repeatedly is operated to allow the walnut grain 9 to be supplied to the mold 18 in a initial state in which it is stopped.

However, in the walnut automatic supply apparatus according to the related art, sensors sensing the walnut grain should be installed at two or more portions in order to recognize the regular position of the walnut grain, and a plurality of springs and link structures should be used in order to operate the discharging gate, thereby causing complexity of the apparatus, an increase in a manufacturing cost, and deterioration in productivity.

Further, since the mold is not accurately positioned at a position at which the walnut grain is supplied, the supplied walnut grain drops outside of the mold and a size of the walnut grain supplied to the mold is not constant, thereby not maintaining unique quality of the walnut cake.

DISCLOSURE

Technical Problem

The present invention provides a walnut supply apparatus capable of automatically supplying a walnut grain having various sizes to a mold.

The present invention also provides a walnut supply apparatus that does not use an additional sensor sensing presence or absence of a walnut grain or a position of the walnut grain.

The present invention also provides a walnut supply apparatus capable of accurately supplying a walnut grain by synchronizing a position of a mold and a feeder supplying the walnut grain with each other.

Technical Solution

According to an exemplary embodiment of the present invention, there is provided a walnut supply apparatus including: a vibrator applying vibration to a walnut grain to move the walnut grain; a walnut discharging guide part formed at an upper portion of the vibrator to discharge the walnut grain from the vibrator; a feeder formed at one end of the walnut discharging guide part along a moving direction of the walnut grain to supply the walnut grain into a mold; a feeder driving part pivoting the feeder to drop the walnut grain disposed on the feeder into the mold; and a mold driving unit cyclically transferring the mold along a predetermined path.

As described above, the feeder dropping the walnut grain is provided, thereby making it possible to supply the walnut grain to the mold without using an electronic/electric sensor.

The feeder driving part may be linked or synchronized with the mold driving part to be operated.

When the mold is positioned under the feeder by the mold driving part, the feeder driving part and the mold driving part may be linked with each other so that the feeder introduces the walnut grain into the mold.

The mold driving part may stop the transferring of the mold when the feeder driving part is operated.

The feeder may be rotatably provided in a supporting frame supporting one end of the walnut discharging guide part, and an upper end of the supporting frame may be formed with a feeder mounting hole into which an upper portion of the feeder is inserted to pivot.

The feeder mounting hole may be larger than the feeder.

The feeder may receive the walnut grain in a state in which an upper end thereof is in parallel with the upper end of the supporting frame and may drop the walnut grain while pivoting by the feeder driving part in a state in which the walnut grain is seated.

The walnut grain disposed on the upper end of the feeder may be dropped through the feeder mounting hole when the feeder pivots.

An upper end of at least one of the walnut discharging guide part and the feeder may be formed with a groove preventing separation of the walnut grain.

One end of the walnut discharging guide part adjacent to the feeder may be formed with a separation preventing part preventing the walnut grain from being separated from the upper end of the feeder.

When the walnut grain is dropped, the feeder may block the walnut grain transferred from the walnut discharging guide part from being transferred to the upper end of the feeder.

One end of the feeder adjacent to one end of the walnut discharging guide part may block the one end of the walnut discharging guide part while rotating by the pivot, thereby blocking the walnut grain from being transferred from the walnut discharging guide part to the upper surface of the feeder.

The upper end of the supporting frame may be formed with sensing parts sensing the walnut grain or a rear end of the feeder at both sides thereof along a length direction of the feeder mounting hole.

When the sensing part senses the walnut grain disposed on the upper end or the upper surface of the feeder or the rear end of the rotating feeder, an operation of the vibrator may be stopped.

One end of the walnut discharging guide part and one end of the upper surface of the feeder may be spaced apart from each other.

The feeder driving part may include a rotating pin formed at a side of the feeder and a connecting rod having one end connected to the rotating pin and the other end connected to the mold driving part, wherein both ends of the connecting rod may be formed in a ball joint form.

An edge of a bowl of the vibrator may include a moving path having a spiral or helical shape, and a portion of the moving path adjacent to an upper end of the bowl may be formed with a width adjusting part adjusting a width of the moving path.

The upper end of the bowl may be provided with a discharging door discharging a walnut grain having a predetermined size or less to the outside of the bowl.

A lower end of the discharging door may be provided a support formed to be inclined downwardly.

Both sides of the width adjusting part may be formed with step parts at which a height of the moving path is changed.

The moving path may be formed by a bottom surface and a side wall surface, wherein the bottom surface may be inclined downwardly toward the sidewall surface.

A front end of the seating part formed on the upper surface of the feeder may be opened and a back end thereof may be formed with a partition wall, wherein the partition wall may prevent the walnut grain from being separated from the seating part in the case in which the feeder is abnormally operated.

Advantageous Effects

As set forth above, in the walnut supply apparatus according to the exemplary embodiment of the present invention, since a process itself of introducing the walnut grain into the mold is automatically performed by the walnut supply apparatus unlike the case of the related art, the number of workers is minimized, thereby making it possible to reduce the manufacturing cost through reduction of labor costs.

The walnut supply apparatus according to the exemplary embodiment of the present invention sorts and uses the walnut grain contained in the walnut cake by a predetermine size, thereby making it possible to maintain the same quality at all times.

Since the walnut supply apparatus according to the exemplary embodiment of the present invention may sense the position of the walnut grain and the presence or absence of the walnut grain and accurately supply the walnut grain to the mold, the manufacturing cost of the walnut supply apparatus may decrease and productivity thereof may increase.

Since the walnut supply apparatus according to the exemplary embodiment of the present invention may adjust the size of the supplied walnut grain using a single vibrator, even in the case of supplying walnut grains having various sizes, there is no need to change the vibrator.

MODE FOR INVENTION

Figure 1:
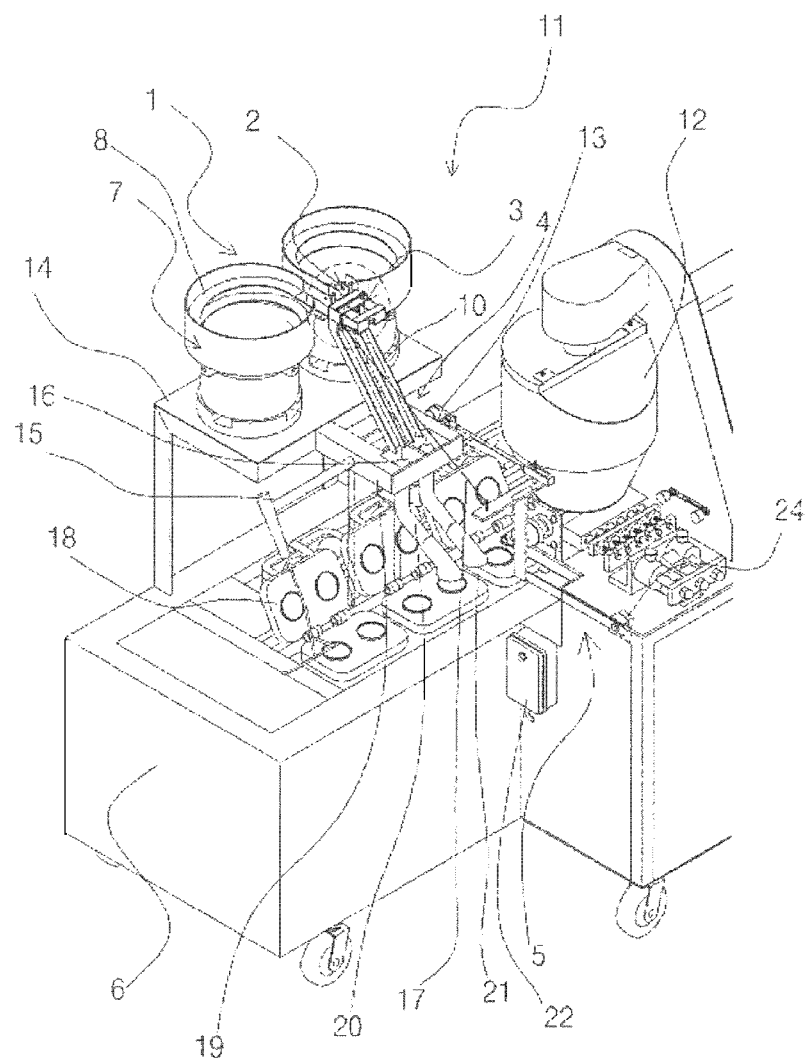
FIGS. 1 to 3 are views showing a walnut automatic supply apparatus according to the related art.

Hereinafter, embodiments of the present invention will be described in detail with reference to the accompanying drawings. However, the present invention will be not limited or restricted to the embodiments below. Like reference numerals proposed in each drawing denote like components.

Figure 4:
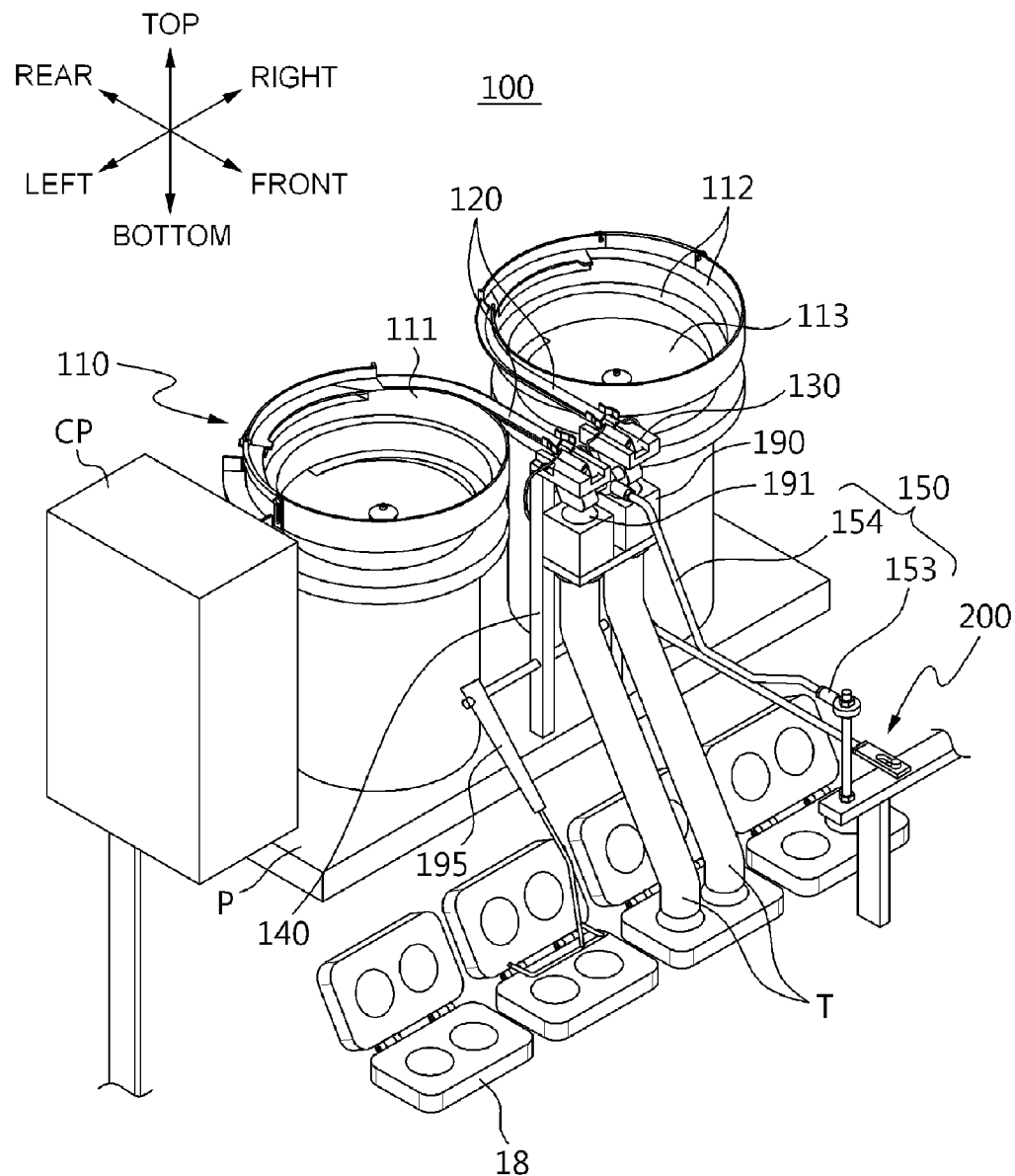
FIG. 4 is a perspective view showing a walnut supply apparatus according to an exemplary embodiment of the present invention.
Figure 8:
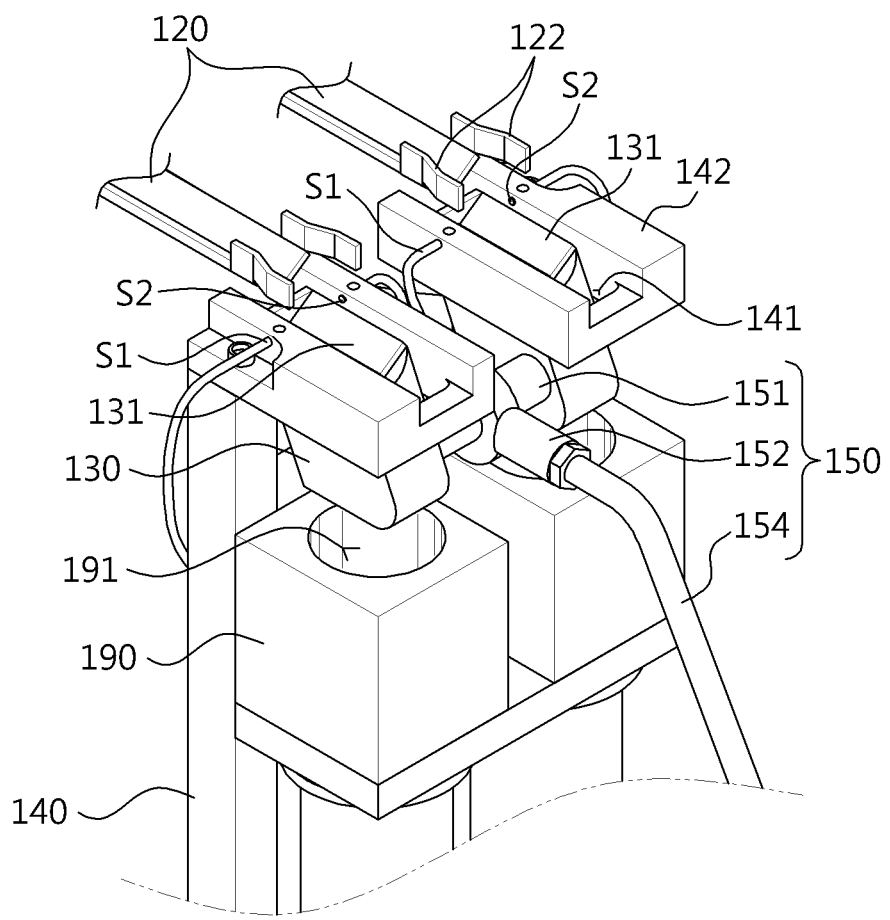
FIGS. 8 to 10 are views showing a shape in which a walnut grain is disposed on a feeder of the walnut supply apparatus of FIG. 4.
Figure 9:
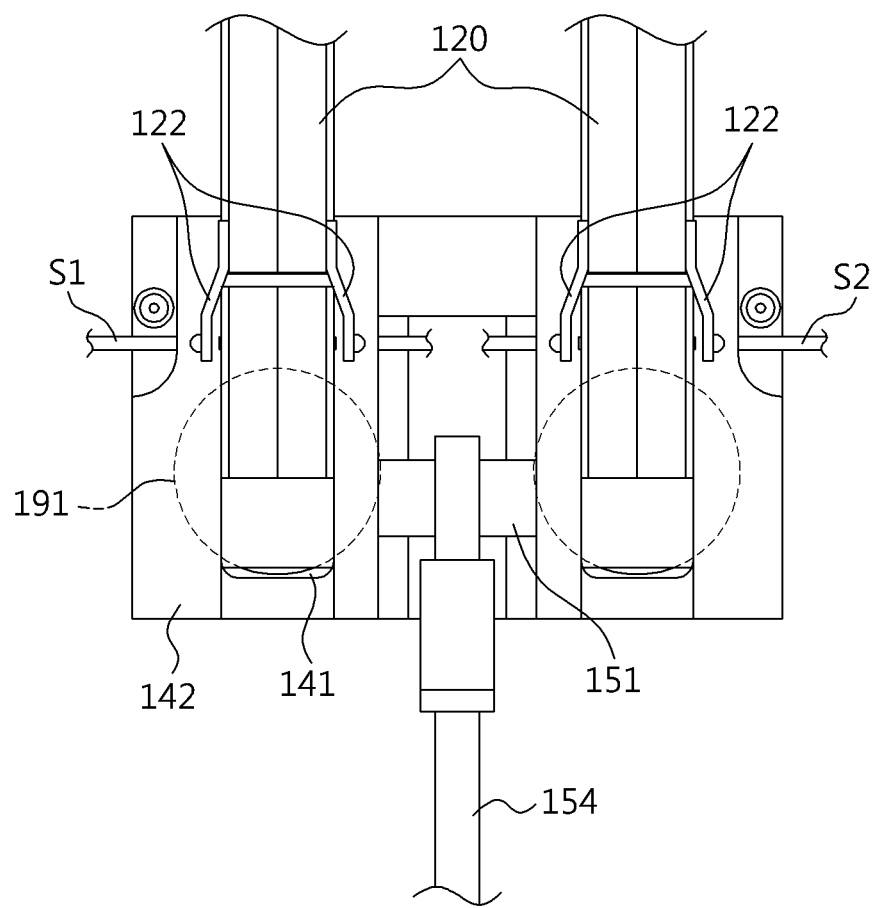
Figure 10:
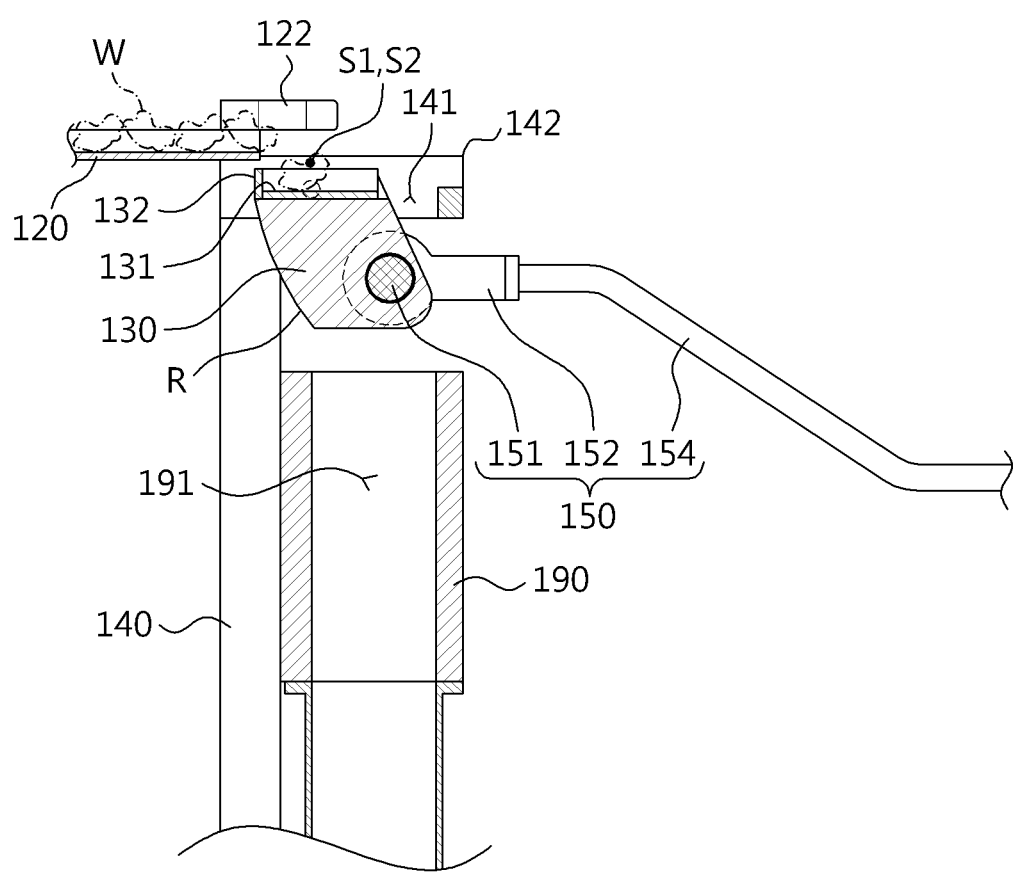
Figure 11:
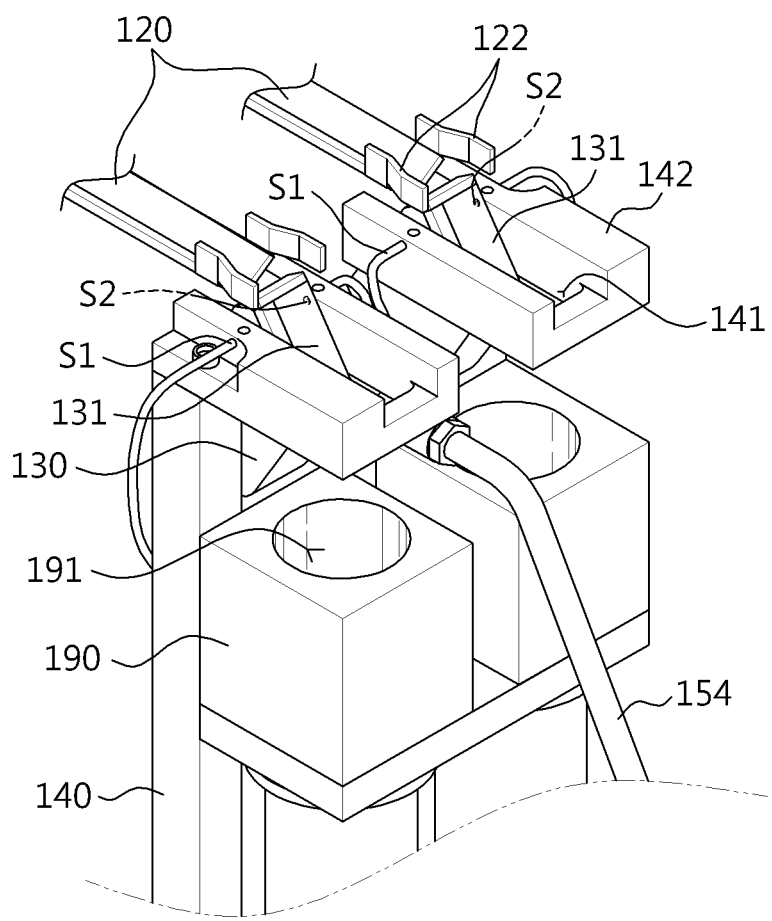
FIGS. 11 to 13 are views showing a shape in which a walnut grain is supplied from the feeder of the walnut supply apparatus of FIG. 4 to a mold.
Figure 12:
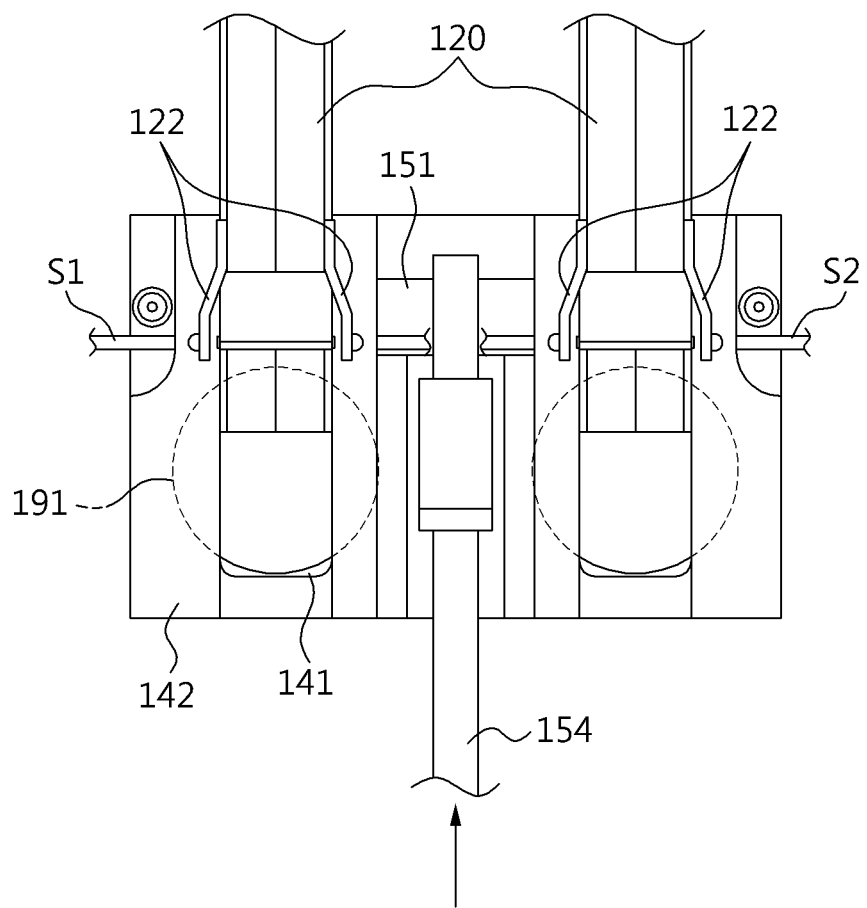
Figure 13:
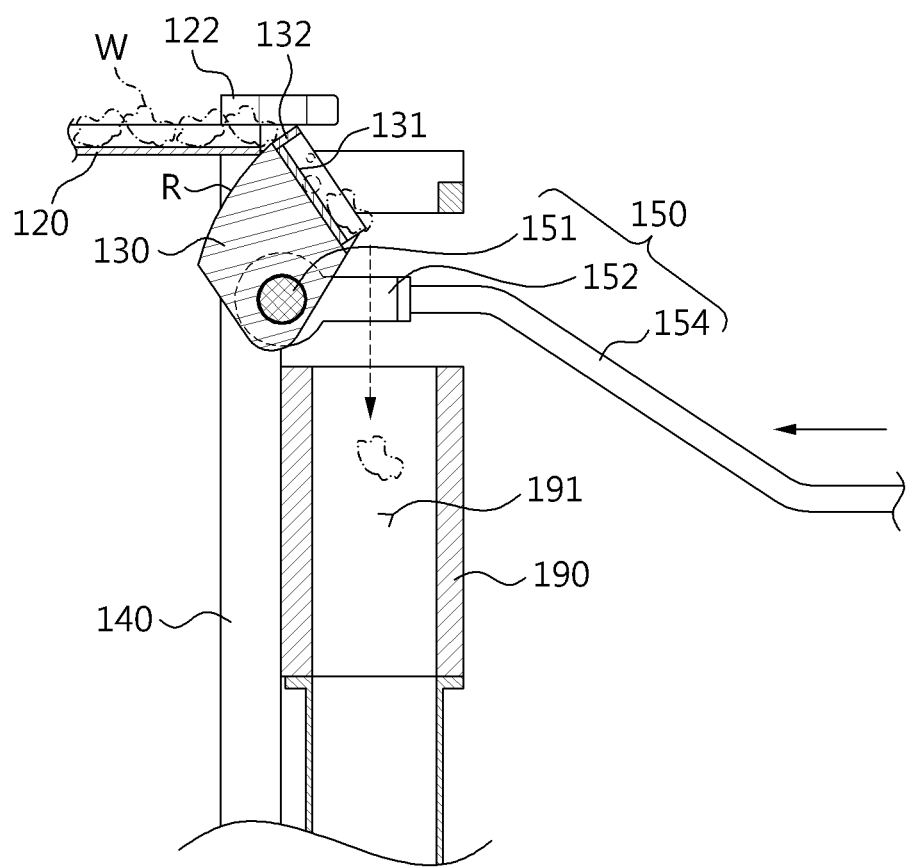

FIG. 4 is a perspective view showing a walnut supply apparatus according to an exemplary embodiment of the present invention; FIGS. 5 to 7B are perspective views showing a vibrator used in the walnut supply apparatus of FIG. 4; FIGS. 8 to 10 are views showing a shape in which a walnut grain is disposed on a feeder of the walnut supply apparatus of FIG. 4; and FIGS. 11 to 13 are views showing a shape in which a walnut grain is supplied from the feeder of the walnut supply apparatus of FIG. 4 to a mold.

Figure 2:
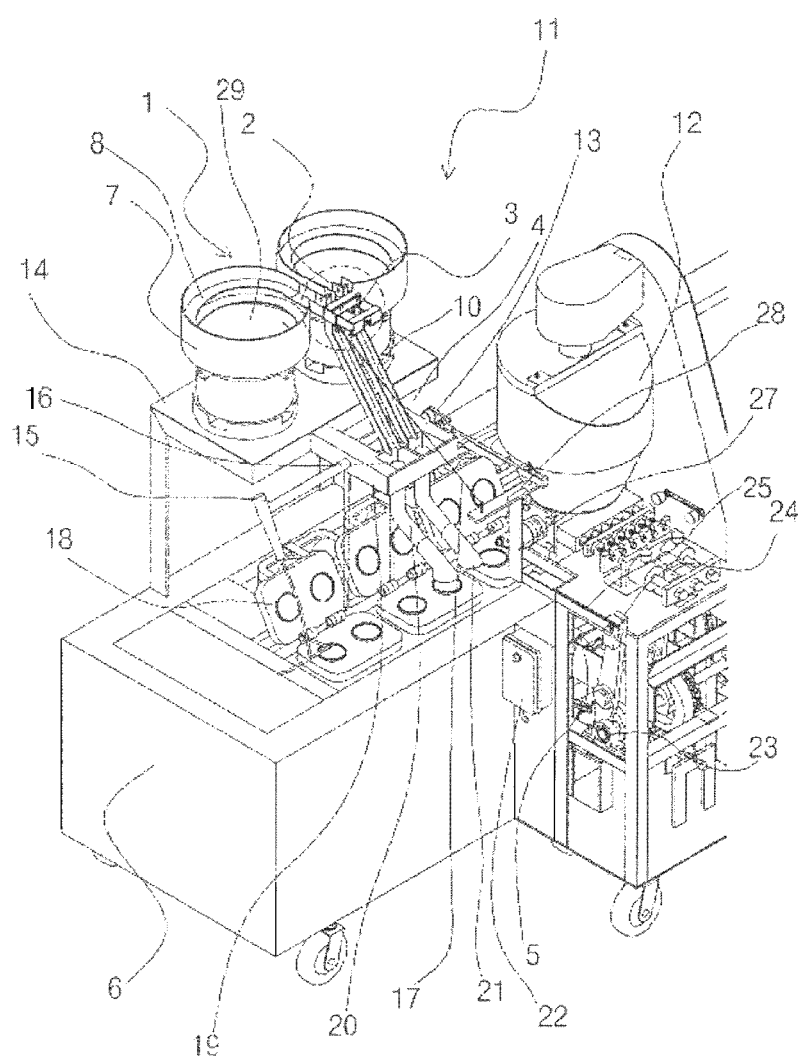
Figure 3:
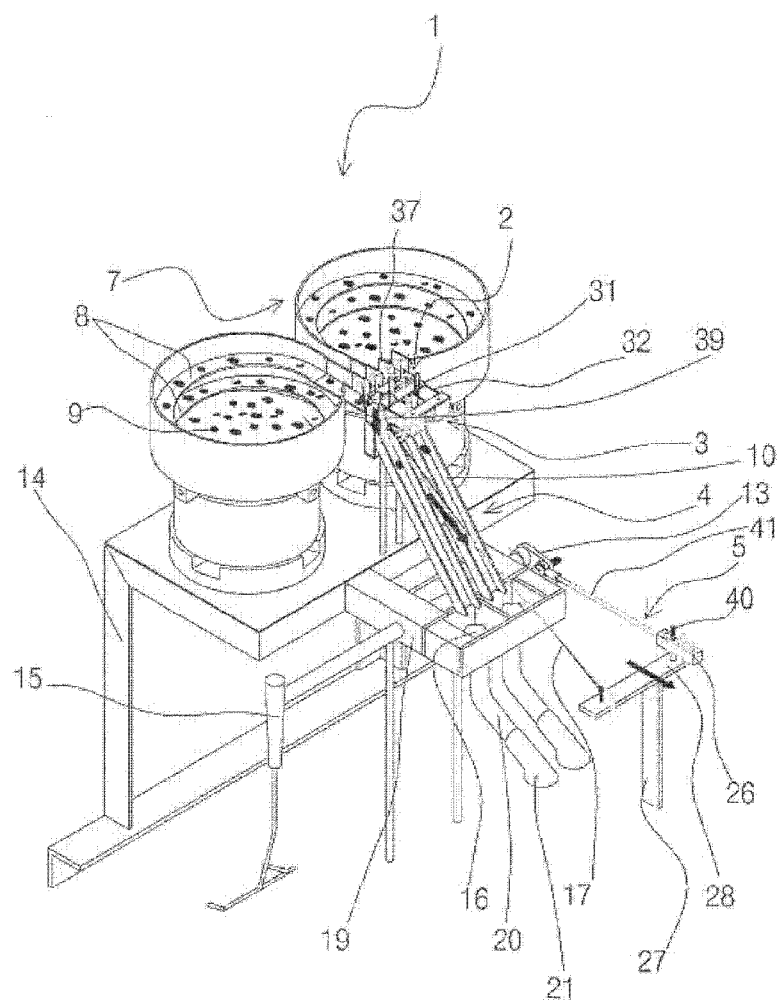

The walnut supply apparatus 100 according to the exemplary embodiment of the present invention is a portion of a baking machine 11, and since remaining configurations except for the walnut supply apparatus 100 are the same as those of the baking machine 11 according to the related art, other portions except for the walnut supply apparatus will be denoted by the same reference numerals used in FIGS. 1 to 3. Hereinafter, the walnut apparatus 100 having a different configuration from the baking machine 11 according to the related art will be described.

First, referring to FIG. 4, the walnut supply apparatus according to the exemplary embodiment of the present invention may automatically introduce or drop a walnut grain W into a mold 18. Particularly, the walnut supply apparatus 100 according to the exemplary embodiment of the present invention may accurately introduce each of walnut grains into each of the molds 18.

To this end, the walnut supply apparatus may include a vibrator 110 applying vibration to the walnut grain W to move the walnut grain W, a walnut discharging guide part 120 formed at an upper portion of the vibrator 110 to discharge the walnut grain from the vibrator 110, a feeder 130 formed at one end of the walnut discharging guide part 120 along a moving direction of the walnut grain to supply the walnut grain into the mold 18, a feeder driving part 150 pivoting the feeder 130 to drop the walnut grain disposed on the feeder 130 into the mold 18, and a mold driving part 200 cyclically transferring the mold 18 along a predetermined path.

As described above, the feeder dropping the walnut grain is provided, thereby making it possible to accurately supply the walnut grain to the mold without using an electronic/electric sensor.

The vibrator 110 may include a bowl 113 formed at an upper portion thereof in a vessel shape in which the walnut grains are filled and a vibration generating part (not shown) installed at a lower portion thereof. The vibrator 110 performs a function of moving a small object, such as powders, a bolt, or the like, by the vibration in a predetermined direction. The bowl 113 is filled with a plurality of walnut grains contained in a walnut cake, or a walnut-shaped bread. When the vibration generating part applies the vibration to the bowl 113 in a state in which the bowl 113 is filled with the walnut grains, the walnut grains are moved toward an edge of the bowl 113. The bowl 113 may have a shape in which the bowl is inclined so as to become low from a central portion thereof to the edge thereof so that the walnut grains are easily moved toward the edge of the bowl 113.

In order to control an operation of the vibrator 110, one side of the vibrator 110 may be provided with a vibrator control box CP. The vibration control box CP may control a vibration size of the vibrator 110, a vibration period thereof, a vibration frequency thereof, or the like, to control the operation of the vibrator 110. In addition, a worker or a user may input or set operating conditions of the vibrator 110 through the vibrator control box CP.

Figure 5:
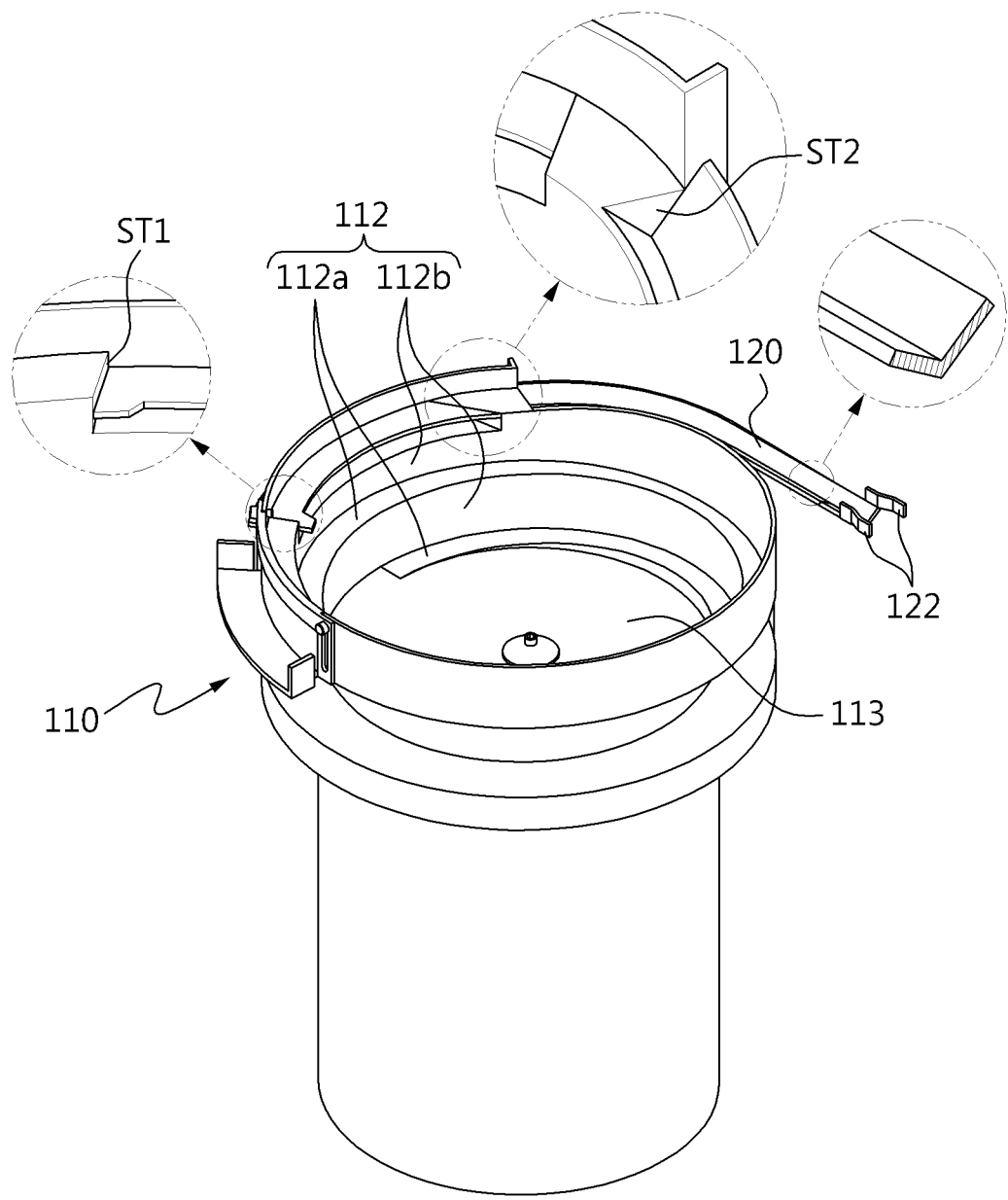
FIGS. 5 to 7B are perspective views showing a vibrator used in the walnut supply apparatus of FIG. 4.

Meanwhile, the edge of the bowl 113 may be formed with a spiral shaped or a helix shaped moving path 112. The walnut grains may be moved from a bottom of the bowl 113 to the walnut discharging guide part 120 formed at an upper end 111 of the bowl 113 through the moving path. The moving path 112 is formed along an inner side wall of the bowl 113 in a spiral shape and connected from the bottom of the bowl 113 to the upper end thereof. As shown in FIG. 5, the moving path 112 may have a shape in which a diameter becomes large from the bottom of the bowl 113 toward the upper end 111 thereof.

The moving path 112 is configured of a bottom surface 112a and a side wall surface 112b, wherein the bottom surface 112a is not horizontally formed but inclined downwardly toward the edge of the bowl 113 or the side wall surface 112b. As described above, when the bottom surface is inclined, the walnut grain may be moved to the upper end 111 of the bowl 113 along the moving path 112 in a state in which it contacts the side wall surface 112b. In the moving path 112, a width of the bottom surface 112a as well as an inclination thereof is an important factor in moving the walnut grain.

The moving path 112 of the bowl 113 performs a function of sorting a size of the walnut grain in addition to the function of moving the walnut grains. That is, according to adjusting the width of the moving path 112, only the walnut grains having a predetermined size may be supplied to the mold 18. As described above, the walnut grain having the predetermined size is supplied to the mold 18 according to the width of the moving path 112, thereby making it possible to maintain quality of the walnut cake to be constant.

Figure 6A:
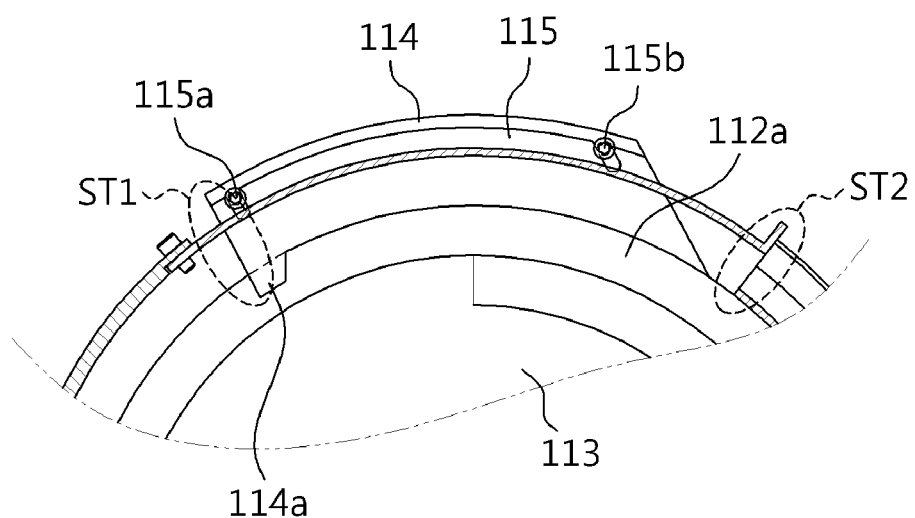
Figure 6B:
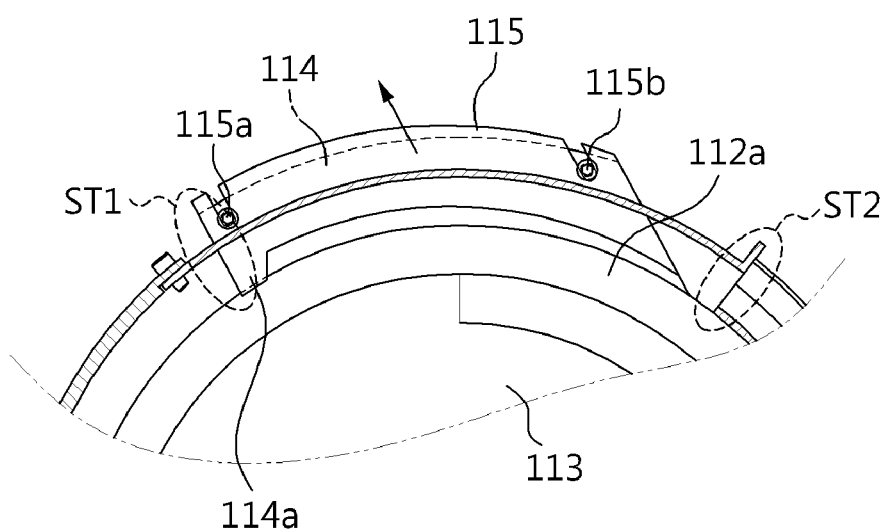

As shown in FIGS. 6A and 6B, the bowl 113 of the vibrator 110 used in the walnut supply apparatus 100 according to the exemplary embodiment of the present invention has a function capable of adjusting the width of the moving path 112. To this end, a portion of the moving path 112 positioned adjacent to the upper end 111 of the bowl 113 may be formed with a width adjusting part 114. The width adjusting part 114 may move at a lower portion of a flange 115 protruded outwardly from the upper end 111 of the bowl 113 in a radial direction of the bowl 113.

The width adjusting part 114 may be fixed to the flange 115 by fixed members 115a and 115b such as bolts, or the like. One end of the width adjusting part 114 may be formed with a sorting part 114a capable of directly contacting the walnut grain to push a walnut grain having a size larger than that of the walnut grain to be supplied and drop the walnut grain into the bottom of the bowl 113.

The width of the moving path 112 may be adjusted by loosening the fixed members 115a and 115b and pushing the width adjusting part 114 toward the center of the bowl 113 or pulling the width adjusting part 114 toward the outside. In the case in which the width adjusting part 114 is pushed toward the center of the bowl 113, since a width of the moving path 112 protruded toward the center of the bowl 113 increases, a walnut grain having a relatively large size may be supplied (See FIG. 6A). on the other hand, in the case in which the width adjusting part 114 is pulled toward the outside, since a width of the moving path 112 protruded toward the center of the bowl 113 decrease, a walnut grain having g relatively small size may be supplied (See FIG. 6B).

Meanwhile, referring to FIGS. 5 to 6B, both sides of the width adjusting part 114 in a length direction may be formed with two step parts ST1 and ST2. As described above, the step parts ST1 and ST2 at which a height of the moving path is changed are formed at the both side of the width adjusting part 114 together with the width adjusting part 114, thereby making it possible to selectively supply the walnut grain only having a relatively large size. When the walnut grain having a relatively small size passes through the step part ST1 and ST2, that is, when it drops from a high moving path to a low moving path, it is separated from the moving path to drop into the bottom of the bowl 113, and only the walnut grain having a relatively large size may pass through the step parts ST1 and ST2 to thereby by supplied into the mold 18.

Figure 7A:
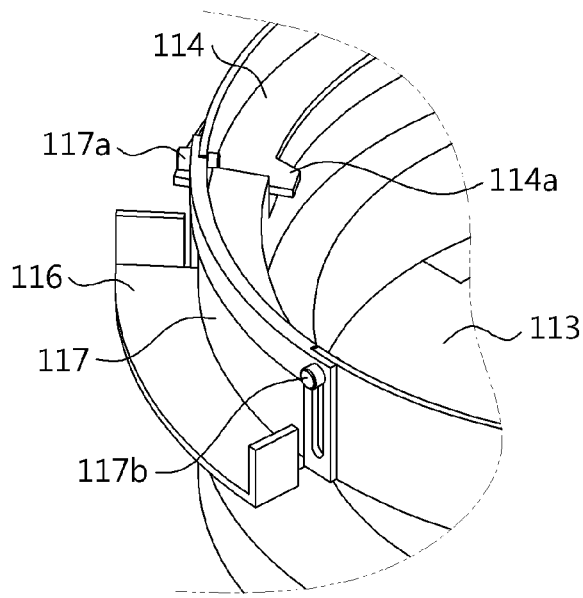
Figure 7B:
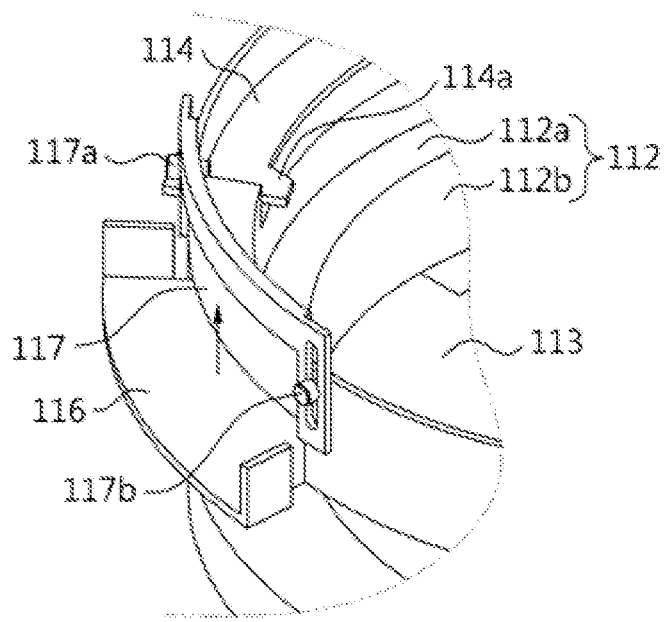

In addition, as shown in FIGS. 7A and 7B, the upper end 111 of the bowl 113 may be provided with a discharging door 117 discharging the walnut grain having a predetermined size or less outside the bowl 113. To this end, the upper end 111 of the bowl 11 may be installed with the discharging door 117 moving vertically, and a lower end of the discharging door 117 may be formed with a support 116 inclined downwardly. The discharging door 117 may be fixed to the upper end 111 by fixed members 117a and 117b. When the fixed members 117a and 117b are unlocked and the discharging door 117 is lifted to adjust an interval at which the discharging door 117 is opened, a walnut grain capable of being passed through the interval may be discharged to the outside through the support 116 (See FIG. 7B).

The walnut grain transferred to the upper end along the moving path 112 formed in the bowl 113 finally deviates from the vibrator 110 through the walnut discharging guide part 120 formed at a outer surface of the upper end 111 in a tangential direction. The walnut discharging guide part 120 formed at the upper end 111 of the bowl 113 is formed to be roughly straight and may include a predetermined groove or furrow in order to prevent the walnut grain from being deviated or being separated from the walnut discharging guide part 120.

Referring to FIG. 5, the walnut discharging guide part 120 may have a "v" shape. However, the groove formed in the walnut discharging guide part 120 is not limited to having the V shape, but may have any shape as long as it may prevent the walnut grain from being separated from the walnut discharging guide part 120. The walnut discharging guide part 120 may transfer the walnut grain while being excited by the vibrator 110.

A lower portion of one end of the walnut discharging guide part 120 may be provided with the feeder 130 in order to introduce the walnut grain into the mold 18. An upper end or an upper surface of the feeder 130 may be formed with a seating part 131 such as a groove, or the like, so that the walnut grain transferred from the walnut discharging part 120 may be stably seated. The seating part 131 formed at the upper surface of the feeder 130 may have a "V" shape, but is not limited to this shape. As described above, the upper end of at least one of the walnut discharging guide part 120 and the feeder 130 may be formed with the groove preventing separation of the walnut grain.

The feeder 130 is positioned at the lower portion of one end of the walnut discharging guide part 120, wherein one end of the walnut discharging guide part 120 or one end of a separation preventing part 122 and a rear end portion of the feeder may be overlapped with each other, when being viewed from a side. The walnut discharging guide part 120 and the feeder should be overlapped with each other, and then it may be possible to prevent the walnut grain from dropping outside of the feeder 130 when the walnut grain drops from the walnut discharging guide part 120.

In addition, both surfaces of one end of the walnut discharging guide part 120 may be formed with the separation preventing parts 122 having a interval therebetween larger than a width of the walnut discharging guide part 120 so that the walnut grain is properly supplied from the walnut discharging guide part 120 to the upper surface of the feeder 130. The separation preventing parts 122 may have the interval therebetween larger than a width of the feeder 130, and one ends thereof may be extended to positions at which the separation preventing parts 122 are overlapped with the feeder 130.

Meanwhile, one end or an exit end of the walnut discharging guide part 120 and the upper surface of the feeder or one end (that is, a rear end) of the seating part 131 may be spaced apart from each other.

As shown in FIGS. 8 and 9, the separation preventing part 122 is extended forwardly from one side of the walnut discharging guide part 120 and may have a length at which it is partially overlapped with the feeder 130. The separation preventing part 122 formed as described above is provided, thereby making it possible to prevent the walnut grain from not being accurately seated on the upper surface of the feeder 130 but dropping aside.

The walnut discharging guide part 120 may have the width not smaller than that of the upper end of the feeder 130. It is preferable that the walnut discharging guide part 120 has the width not larger than that of feeder 130. As described above, the feeder 130 has the width larger than that of the walnut discharging guide part 120, thereby making it possible to more stably transfer the walnut grain from the walnut discharging guide part 120 to the feeder 130.

The vibrator may be provided on a plate P installed on a upper portion of a body 6 of the baking machine 11, and the feeder may be rotatably installed to a supporting unit 140 fixedly installed to a lower end of the plate P so as to be positioned in front of the vibrator 110. Describing more precisely, the feeder may be installed to the supporting frame 140 so as to enable to pivot or hinge with respect to the support frame 140. The upper end of the feeder 130 may be receive the walnut grain from the walnut discharging guide part 120 in a state in which it is lower than an upper end of the supporting frame 140.

As shown in FIG. 4, the supporting frame 140 is a member such as a kind of pillar supporting the feeder 130 so as to allow the feeder to pivot.

Meanwhile, referring to FIGS. 8 to 13, the upper end of the supporting frame 140 may be formed with a feeder mounting hole 141 in which the feeder 130 may be mounted and move. The feeder mounting hole 141 may have a rectangular shape similar to that of the upper surface of the feeder 130. In this case, the feeder mounting hole 141 may be formed to be larger than the feeder 130. That is, the feeder mounting hole needs to have a long side length longer than that of the feeder 130. The reason is that when the feeder rotates in the feeder mounting hole 141, the walnut grain W needs to drop downwardly through a space formed between a front end of the feeder mounting hole 141 and the feeder 130.

The feeder 130 is rotatably provided in the supporting frame 140 supporting one end of the walnut discharging guide part 120, and the upper end of the upper end 142 of the supporting frame 140 may be formed with the feeder mounting hole 141 in which an upper portion of the feeder 130 is inserted to pivot.

The feeder mounting hole 141 may be formed to have a step from an upper surface of the upper end 142 of the supporting frame 140. The feeder 130 may be rotatably mounted on the upper end 142 of the supporting frame having the feeder mounting hole 141 formed therein, but a connection structure between the feeder 130 and the upper end 141 is not limited.

Referring to FIG. 10, the front end of the seating part 131 of the feeder 130 formed on the upper surface of the feeder 130 is opened; however, the rear end thereof is formed with a partition wall 132. The partition wall 132 formed at the rear end of the seating part 131 may prevent the walnut grain from being separated from the seating part 131. For example, in the case in which the rear side of the seating part 131 rather than the front side thereof abnormally goes down, the partition wall 132 may prevent the grain disposed on the seating part 131 from dropping through the rear end of the seating part 131.

Meanwhile, a rear surface of the feeder 130 may include a curved portion R formed of a curved surface. As described above, the curved portion R is formed at the rear surface of the feeder 130, such that in the case in which the feeder 130 rotates or pivots, an interval between the upper end 142 of the supporting frame 140 and the rear surface of the feeder is formed, thereby making it possible to prevent a wrongly transferred walnut grain from dropping through this interval. That is, the curved portion R is formed, thereby making possible to prevent the walnut grain from falling into or dropping through a gap between the feeder 130 and the supporting frame 140.

FIGS. 8 to 10 shows a state in which the feeder 130 does not rotate or does not pivot at the upper end 142 of the supporting frame 140. That is, the upper end of the feeder 130 and the upper surface of the upper end 142 of the supporting frame 140 are maintained in a state in which they are almost parallel with each other, and walnut grain W is disposed on the seating part 131 of the feeder 130 in this state. In this state, when a lower portion of the feeder 130 moves rearwardly as shown in FIGS. 11 to 13, the seating part 131 is inclined while descending downwardly at a front end thereof. When the lower portion of the feeder 130 more moves rearwardly and the front end of the seating part 131 more moves downwardly, a space is formed at a front of the feeder mounting hole 141 as shown in FIG. 12, and walnut grain may be introduced into the mold 18 through this space.

The feeder 130 receives the walnut grain in a state in which the upper end thereof or the seating part 131 and the upper end 142 of the supporting frame 140 are in parallel with each other, the feeder may introduce the walnut grain while pivoting by the feeder driving part 150 in a state in which the walnut grain is seated.

When the feeder 130 pivots, the walnut grain disposed on the upper end of the feeder 130 and the seating part 131 may be introduced into the mold 18 through the feeder mounting hole 141.

Meanwhile, under the feeder 130 or the feeder mounting hole 141 may be formed a dropping path 191 preventing the walnut grain from dropping outside the mold 18 or from dropping into an outer side of the mold 18. Here, the dropping path 191 is a portion forming a dropping path so that the walnut grain drops as vertical as possible when it drops downwardly while sliding from the seating part 131 of the feeder 130. The mold 18 is positioned under the dropping path 191. The dropping path 191 may be formed in a shape in which it is in communicated with a path body 190 fixed to the supporting frame 140.

In this case, the dropping path 191 may be formed to be positioned prior to (that is, in front of) a front end of the seating part 131 in a horizontal state. When the feeder 130 rotates or pivots based on a rotation shaft, the front end of the seating part 131 protrudes forwardly while drawing an arc. At this time, the front end of the seating part 131 protrudes more forwardly than that of the seating part 131 in the horizontal state. Therefore, since the dropping path 191 need to be installed at a position approximately equal to that of the front end of the seating part 131 protruding forwardly, it is preferable that the dropping path is positioned prior to (that is, in front of) the upper surface of the feeder 130 or the front end of the seating part 131 in the horizontal state.

Meanwhile, the seating part 131 of the feeder 130 is approximately in the horizontal state, a lower end portion of the feeder 131 is formed to protrude more forwardly than the front end of the seating part 131. That is, as shown in FIG. 10, the feeder 130 has a parallelogram shape inclined toward one side, when being viewed in a side. Since the feeder 130 has this shape, when the feeder 130 and the seating part 131 of the feeder 130 is in the horizontal state, the dropping path 191 may be blocked by the feeder 130, more specifically by the lower end portion of the feeder 130.

As described above, since the dropping path 191 is blocked by the lower end or the lower end portion of the feeder 130 in the horizontal state, the lower end or the lower end portion of the feeder may be round or curved in order to prevent interference with the dropping path 191.

Meanwhile, as shown in FIG. 8, the upper end 142 of the supporting frame 140 may include sensing parts S1 and S2 formed at both ends thereof in a width direction of the feeder 130. That is, the both sides of the upper end 142 of the supporting frame 140 may be formed with the sensing parts S1 and S2 sensing the walnut grain or the rear end of the feeder 130 along a long side length direction of the feeder mounting hole 141 formed therein. The sensing parts S1 and S2 are formed at the upper end 142 of the supporting frame 140, particularly, are each formed at both ends of the width direction of the feeder 130 in the long side length direction of the feeder mounting hole 141, and my be installed to the upper end 142 of the supporting frame 140.

Referring to FIG. 8, the sensing parts S1 and S2 may be installed at a position higher than the upper end of the feeder 130. When the walnut grain is disposed on the seating part 131 of the feeder 130, the sensing parts S1 and S2 sense the walnut grain, and when the sensing parts S1 and S2 sense the walnut grain, the vibrator temporarily stops the operation of the vibrator 110, thereby making it possible to preventing the walnut grain from being additionally supplied. In addition, as shown in FIG. 13, when the feeder 130 rotates, the rear end of the feeder 130 ascends, and when the sensing parts S1 and S2 sense the ascending rear end of the feeder 130, the operation of the vibrator 110 may be temporarily stopped.

The sensing parts S1 and S2 may be formed of optical sensors capable of sensing the walnut grain or the rear end of the feeder 130, and sensing signals of the sensing parts S1 and S2 may be transferred to the controlling part 22 or the vibrator control box CP controlling the walnut supply apparatus 100. Meanwhile, a problem in operations of the sensing parts S1 and S2 occurs, such that although the walnut grain is disposed on the seating part 131 of the feeder 130, the vibrator is not stopped and the walnut grain may be transferred to the feeder 130. In this case, the feeder 130 may block the walnut grain from being additionally transferred thereto.

As shown in FIGS. 11 to 13, when the feeder 130 rotates in order to drop the walnut grain disposed on the seating part 131 of the feeder 130, the rear end portion of the feeder 130 ascends, and the ascending rear end portion of the feeder 130 blocks one end of the walnut discharging guide part 120. Therefore, during a process in which the feeder 130 introduces the walnut grain into the mold 18, the rear end of the feeder 130 blocks an exit of the walnut discharging guide part 120, thereby making it possible to blocking the walnut grain from being transferred to the feeder 130.

When the feeder 130 drops the walnut grain into the mold 18, the feeder 130 may block the walnut grain transferred from the exit end of the walnut discharging guide part 120 from being transferred to the upper end of the feeder 130 or the seating part 131. That is, when feeder 130 rotates by the pivot, one end, that is, the rear end thereof adjacent to the one end or the exit end of the walnut discharging guide part 120 blocks the one end or the exit end of the walnut discharging guide part 120, thereby making it possible to blocking the walnut grain from being transferred from the walnut discharging guide part 120 to the upper surface of the feeder 130 or the seating part 131. As described above, the feeder 130 used in the walnut supply apparatus 100 according to the exemplary embodiment of the present invention is a member simultaneously serving as the feeder and a stopper introducing the walnut grain and preventing the walnut grain from being additionally transferred during introducing the walnut grain.

Meanwhile, the feeder 130 of the walnut supply apparatus according to the exemplary embodiment of the present invention may accurately supply the walnut grain to the mold 18. To this end, the feeder driving part operating the feeder 130 and the mold driving part 200 cyclically transferring the mold 18 is linked or mechanically synchronized with each other to thereby be operated.

When the mold is positioned under the feeder 130 or the dropping path 191 by the mold driving part 200, the feeder driving part 150 and the mold driving part 200 may be linked with each other to be operated so that the feeder 130 introduce the walnut grain into the mold 18.

The mold driving part 200, which is a driving part circulating the mold 18 along a predetermined closed circulation loop, needs to stop the transferring of the mold 18 at a moment at which the walnut grain is introduced into the mold 18, in order to introduce the walnut grain into the mold 18. To this end, the mold driving part 200 may stop the transferring of the mold 18 when the feeder driving part 150 is operated. The feeder driving part 150 is operated, which means that the feeder 130 rotates or pivots in order to dropping the walnut grain. Therefore, when the feeder driving part 150 is operated, the mold driving part 300 also needs to stop being operated and allow the mold 18 to be positioned at a position at which the mold 18 may receive the walnut grain.

The feeder driving part 150 may include a rotating pin 151 rotatably formed at a side of the feeder 130 and a connecting rod 154 having one end 152 connected to the rotating pin 151 and the other end 153 connected to the mold driving part 200. The connecting rod 154 may have a first ball joint 152 formed at one end and connected to the rotating pin and a first ball joint 153 formed at the other end and connected to the mold driving part 200. As described above, since both ends of the connecting rod 154 is formed of the ball joints 152 and 153, the connecting rod 154 and the rotating pin 151 may more freely move. The rotating pin 151 may include a ball bearing (not shown) formed thereto and engaged with the first ball joint 152.

As shown in FIG. 4, the feeder driving part 151 may be operated in a state in which it is linked or mechanically synchronized with the mold driving part 200 transferring the mold 18. Here, the mold driving part 200 shown in FIG. 4, which is a portion of the entire mold driving part, is linked with a structure in which various cams and a clutch are operated in order to cyclically transferring the mold 18.

As described above, since the feeder driving part 150 is linked with the mold driving part 200, when the mold is positioned under the feeder 130, the transferring of the mold may be stopped and the walnut grain may be supplied into the mold 18.

In order to supply the walnut grain to the mold 18, a lower end of the dropping path 191 may include a flexible tube T connected thereto, and distal end of the tube T may be positioned over the mold 18. Here, the tube T and the path body 190 are connected to each other using a bolt (not shown) capable of being adjusted at a connection position between the tube T and the path body 190, a position of the distal end of the tube T may be freely set.

In addition, the mold driving part 200 may have a walnut cake discharging part 195 connected thereto so as to be synchronized with each other. Referring to FIG. 4, when the feeder driving part 150 is linked with the mold driving part 200 and supplies the walnut grain into the mold 18, a mold 18 positioned at the left of a mold 18 is a state in which a walnut cake is present, and when the feeder driving part 150 is operated, the walnut cake discharging part 195 is also operated, thereby making it possible to discharging the walnut cake from the mold 18. A lower end of the walnut cake discharging part 195, that, a portion directly contacting the walnut cake may further be formed with a unit capable of preventing a damage of the walnut cake.

Hereinafter, an operation of the walnut supply apparatus 100 according to the exemplary embodiment of the present invent will be described.

When the vibrator is operated to start vibrating, the walnut grains filled in the vibrator 110 move to the edge of the bowl 111 and move up to the walnut discharging guide part 120 along the moving path 112 formed at the edge of the bowl 113. During this procedure, a walnut grain having a predetermined size may be sorted by a width of the moving path 112 and transferred up to the walnut discharging guide part 120. The walnut grain arriving at the distal end or exit end of the walnut discharging guide part 120 is disposed on the seating part 131 of the feeder 130 positioned under the exit end of the walnut discharging guide part 120.

The walnut grain disposed on the seating part 131 of the feeder 130 is sensed by the sensing parts S1 and S2, and when the sensing parts S1 and S2 sense that the walnut grain is present on the seating part 131, the sensing signal is transferred to the controlling part 22 or the vibrator control box CP to temporarily stop the operation of the vibrator 110, thereby preventing the walnut grain from being additionally transferred to the seating part 131. In this state, when the mold 18 is disposed at a position at which the mold 18 receives the walnut grain by the mold driving part 200, the mold driving part 200 reserves the transferring of the mold 18 for a moment, and the feeder driving part 150 allows the feeder 130 to rotate or pivots, thereby dropping the walnut grain downwardly disposed on the seating part 131. At this time, since the mold driving part 200 and the feeder driving part 150 are mechanically synchronized with each other, when the mold 18 is disposed at the position at which it receives the walnut grain, the feeder driving part 150 may allow the feeder 13o to rotate or pivots.

Meanwhile, when the feeder 130 rotates or pivots by the feeder driving part 150, the rear end of the feeder 130 ascends, which is sensed by the sensing parts S1 and S2 sense, and then the operation of the vibrator 110 may be temporarily stopped. In addition, since the ascending rear end of the feeder 130 blocks the exit end of the walnut discharging guide part 120, it is possible to prevent the following walnut grain from being transferred to the seating part 131.

As shown in the accompanying drawings, the number of vibrator 110, feeder 130, and sensing parts S1 and S2 which are formed in the walnut supply apparatus according to the exemplary embodiment of the present invention may be one or more.

As described above, the mold driving part transferring the mold and the feeder driving part moving the feeder are linked with each other without using a separate sensor except for the sensor controlling the operation of the vibrator, thereby making it possible to accurately introduce the walnut grain into the mold by stopping the transferring of the mold and moving the feeder when the mold is positioned at a introduction position of the walnut grain. Further, the feeder itself may implement all functions of the feeder-stopper preventing other walnut grain from being transferred to the upper surface of the feeder when the walnut grain is supplied, in addition to supplying the walnut grain.

Hereinabove, although the present invention is described by specific matters such as concrete components, and the like, exemplary embodiments, and drawings, they are provided only for assisting in the entire understanding of the present invention. Therefore, the present invention is not limited to the exemplary embodiments. Various modifications and changes may be made by those skilled in the art to which the present invention pertains from this description. Therefore, the spirit of the present invention should not be limited to the above-described exemplary embodiments, but the following claims as well as all modified equally or equivalently to the claims are intended to fall within the scopes and spirits of the invention.

INDUSTRIAL APPLICABILITY

An industrial applicability is included in the description of the present application.

The invention claimed is:

1. A walnut supply apparatus comprising:
   a vibrator applying vibration to a walnut grain to move the walnut grain;
   a walnut discharging guide part formed at an upper portion of the vibrator to discharge the walnut grain from the vibrator;
   a feeder formed at one end of the walnut discharging guide part along a moving direction of the walnut grain to supply the walnut grain into a mold;

a feeder driving part pivoting the feeder to drop the walnut grain disposed on the feeder into the mold; and a mold driving unit cyclically transferring the mold along a predetermined path, wherein the feeder is rotatably provided in a supporting frame supporting one end of the walnut discharging guide part, and an upper end of the supporting frame is formed with a feeder mounting hole into which an upper portion of the feeder is inserted to pivot, and wherein the feeder mounting hole is larger than the feeder.

2. The walnut supply apparatus according to claim 1, wherein the feeder driving part is linked or synchronized with the mold driving part to be operated.

3. The walnut supply apparatus according to claim 2, wherein when the mold is positioned under the feeder by the mold driving part, the feeder driving part and the mold driving part are linked with each other so that the feeder introduces the walnut grain into the mold.

4. The walnut supply apparatus according to claim 3, wherein the mold driving part stops the transferring of the mold when the feeder driving part is operated.

5. The walnut supply apparatus according to claim 1, wherein the feeder receives the walnut grain in a state in which an upper end thereof is in parallel with the upper end of the supporting frame and drops the walnut grain while pivoting by the feeder driving part in a state in which the walnut grain is seated.

6. The walnut supply apparatus according to claim 5, wherein the walnut grain disposed on the upper end of the feeder is dropped through the feeder mounting hole when the feeder pivots.

7. The walnut supply apparatus according to claim 1, wherein an upper end of at least one of the walnut discharging guide part and the feeder is formed with a groove preventing separation of the walnut grain.

8. The walnut supply apparatus according to claim 7, wherein one end of the walnut discharging guide part adjacent to the feeder is formed with a separation preventing part preventing the walnut grain from being separated from the upper end of the feeder.

9. The walnut supply apparatus according to claim 5, wherein when the walnut grain is dropped, the feeder blocks the walnut grain transferred from the walnut discharging guide part from being transferred to the upper end of the feeder.

10. The walnut supply apparatus according to claim 5, wherein one end of the feeder adjacent to one end of the walnut discharging guide part blocks the one end of the walnut discharging guide part while rotating by the pivot, thereby blocking the walnut grain from being transferred from the walnut discharging guide part to the upper surface of the feeder.

11. The walnut supply apparatus according to claim 10, wherein the upper end of the supporting frame are formed with sensing parts sensing the walnut grain or a rear end of the feeder at both sides thereof along a length direction of the feeder mounting hole.

12. The walnut supply apparatus according to claim 11, wherein when the sensing part senses the walnut grain disposed on the upper end or the upper surface of the feeder or the rear end of the rotating feeder, an operation of the vibrator is stopped.

13. The walnut supply apparatus according to claim 1, wherein the feeder driving part includes a rotating pin formed at a side of the feeder and a connecting rod having one end connected to the rotating pin and the other end connected to the mold driving part, and both ends of the connecting rod being formed in a ball joint form.

14. The walnut supply apparatus according to claim 13, wherein an edge of a bowl of the vibrator includes a moving path having a spiral or helical shape, and a portion of the moving path adjacent to an upper end of the bowl is formed with a width adjusting part adjusting a width of the moving path.

15. The walnut supply apparatus according to claim 14, wherein the upper end of the bowl is provided with a discharging door discharging a walnut grain having a predetermined size or less to the outside of the bowl.

16. The walnut supply apparatus according to claim 15, wherein a lower end of the discharging door is provided a support formed to be inclined downwardly.

17. The walnut supply apparatus according to claim 14, wherein both sides of the width adjusting part are formed with step parts at which a height of the moving path is changed.

18. The walnut supply apparatus according to claim 14, wherein the moving path is formed by a bottom surface and a side wall surface, the bottom surface being inclined downwardly toward the sidewall surface.

19. The walnut supply apparatus according to claim 14, wherein a front end of the seating part formed on the upper surface of the feeder is opened and a rear end thereof is formed with a partition wall, the partition wall preventing the walnut grain from being separated from the seating part in the case in which the feeder is abnormally operated.

* * * * *